(12) United States Patent
Hamada

(10) Patent No.: US 8,026,023 B2
(45) Date of Patent: Sep. 27, 2011

(54) LITHOGRAPHIC PELLICLE

(75) Inventor: Yuichi Hamada, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 163 days.

(21) Appl. No.: 12/414,854

(22) Filed: Mar. 31, 2009

(65) Prior Publication Data

US 2009/0246646 A1    Oct. 1, 2009

(30) Foreign Application Priority Data

Apr. 1, 2008  (JP) ................................. 2008-094998

(51) Int. Cl.
*G03F 1/14*  (2006.01)
(52) U.S. Cl. .............................. 430/4; 428/14
(58) Field of Classification Search .................... 430/4–5
See application file for complete search history.

(56) References Cited

U.S. PATENT DOCUMENTS

| | | | | |
|---|---|---|---|---|
| 4,000,053 | A | * | 12/1976 | Kimura et al. ............ 204/495 |
| 4,861,402 | A | | 8/1989 | Gordon |
| 5,470,621 | A | | 11/1995 | Kashida et al. ............. 428/14 |
| 2003/0095245 | A1 | | 5/2003 | Mishiro et al. .............. 355/75 |

FOREIGN PATENT DOCUMENTS

| | | |
|---|---|---|
| EP | 0 293 239 A2 | 11/1988 |
| JP | 58-219023 | 12/1983 |
| JP | 5-341502 | 12/1993 |
| JP | 2001-92113 A1 | 4/2001 |

OTHER PUBLICATIONS

JP-05-341502, Yamamoto et al. (on 2nd IDS Mar. 23, 2010)—machine translation.*
JP-2001-092113, Nagata (on 1st IDS Mar. 31, 2009)—machine translation.*
European Search Report dated Feb. 16, 2010.
Machine translation of JP 2001-092113 published Apr. 6, 2001.
Machine translation of JP 05-341502 published Dec. 24, 1993.
Chinese Office Action for Chinese Patent Application No. 200910129926.X dated Feb. 8, 2011 with partial English translation.

* cited by examiner

*Primary Examiner* — Mark F Huff
*Assistant Examiner* — John Ruggles
(74) *Attorney, Agent, or Firm* — Kratz, Quintos & Hanson, LLP

(57) ABSTRACT

A lithographic pellicle is provided that includes a pellicle frame, a pellicle film stretched over one end face of the pellicle frame via a pellicle film adhesive, and an exposure master plate adhesive provided on the other end face, wherein corners formed between a pellicle film adhesion face and exposure master plate adhesion face of the pellicle frame and inside and outside faces of the frame are subjected to C chamfering, and the chamfer dimension on the exposure master plate adhesion face is greater than C0.35 (mm) but no greater than C0.55 (mm).

7 Claims, 2 Drawing Sheets

LITHOGRAPHIC PELLICLE

BACKGROUND OF THE INVENTION

1. Field of the Invention

The present invention relates to a lithographic pellicle that is used as a debris shield for a lithography mask when producing a liquid crystal display panel or a semiconductor device such as an LSI or a ULSI.

2. Description of the Related Art

In the production of a semiconductor such as an LSI or a ULSI or the production of a liquid crystal display panel, a pattern is formed by irradiating a semiconductor wafer or a liquid crystal master plate with light; if debris is attached to an exposure master plate used here, since the debris absorbs the light or bends the light, there are the problems that the replicated pattern is deformed, the edge becomes rough, or the background is stained black, thus impairing the dimensions, quality, appearance, etc. The 'exposure master plate' referred to in the present invention is a general term for lithographic masks and reticles.

These operations are usually carried out in a clean room, but even within a clean room it is difficult to always keep the exposure master plate clean, and a method is therefore employed in which a pellicle that allows exposure light to easily pass through is adhered to the surface of the exposure master plate to act as a debris shield.

In this case, the debris does not become attached directly to the surface of the exposure master plate but becomes attached to the pellicle film, and by focusing on a pattern of the exposure master plate when carrying out lithography the debris on the pellicle film does not become involved in the replication.

The pellicle is basically constituted from a pellicle frame and a pellicle film stretched over the frame. The pellicle film is formed from nitrocellulose, cellulose acetate, a fluorine-based polymer, etc., which allows exposure light (g rays, i rays, 248 nm, 193 nm, 157 nm, etc.) to easily pass through. The pellicle frame is formed from a black-anodized etc. A7075, A6061, A5052, etc. aluminum alloy, stainless steel, polyethylene, etc. The pellicle film is adhered by coating the upper part of the pellicle frame with a good solvent for the pellicle film and air-drying (ref. JP-A-58-219023 (JP-A denotes a Japanese unexamined patent application publication.) or by means of an adhesive such as an acrylic resin, an epoxy resin, or a fluorine resin (ref. U.S. Pat. No. 4,861,402 and JP-A-2001-92113). Furthermore, since an exposure master plate is mounted on a lower part of the pellicle frame, a pressure-sensitive adhesion layer made of a polybutene resin, a polyvinyl acetate resin, an acrylic resin, a silicon resin, etc. and a reticle pressure-sensitive adhesive protecting liner for the purpose of protecting the pressure-sensitive adhesion layer are provided.

The pellicle is installed so as to surround a pattern region formed on the surface of the exposure master plate. Since the pellicle is provided in order to prevent debris from becoming attached to the exposure master plate, this pattern region and a pellicle outer part are separated so that dust from the pellicle outer part does not become attached to the pattern face.

In recent years, the LSI design rule has shrunk to sub-quarter micron, and accompanying this the wavelength of an exposure light source is being shortened, that is, instead of g rays (436 nm) and i rays (365 nm) from the hitherto predominant mercury lamp, a KrF excimer laser (248 nm), an ArF excimer laser (193 nm), an F2 laser (157 nm), etc. are being used. When the wavelength of exposure light becomes shorter, the energy of the exposure light naturally becomes high. When high energy light such as an excimer laser is used, compared with the light of conventional g rays or i rays, the possibility that gaseous material present in the exposure atmosphere will react so as to form foreign matter on the exposure master plate becomes extremely high. Because of this, countermeasures such as minimizing gaseous material within a clean room, carrying out rigorous washing of a reticle, and removing gas-generating substances from materials forming a pellicle have been taken.

In particular, since the pellicle is used by affixing it directly to an exposure master plate, there is a desire for a low gas generation rate for materials forming the pellicle, that is, a reticle adhesive, a film adhesive, an inner wall coating agent, etc., which are formed from organic materials, and improvements have been made. However, cloudy foreign matter, called haze, formed on the exposure master plate cannot be eliminated completely even by washing the reticle or reducing the amount of gas generated from the materials forming the pellicle, and this causes a decrease in the yield in semiconductor production.

Furthermore, the pattern area has been increasing, and there is an increasing demand for managing the area up to the vicinity of the pellicle frame as an exposure area. Because of this, JP-A-2001-92113 discloses carrying out C chamfering for four corners of upper and lower end faces of the pellicle frame. However, the size of the C chamfering of the upper and lower end faces of a conventionally used pellicle frame causes the problem that a pressure-sensitive adhesive for adhesion of an exposure master plate protrudes from the overall width of the frame when the pellicle is mounted on the exposure master plate. Because of this, the problem of a decrease in yield in semiconductor production has not yet been solved.

BRIEF SUMMARY OF THE INVENTION

The present invention has been accomplished in order to solve the above-mentioned problems. That is, it is an object of the present invention to improve the yield in semiconductor production by stably providing a pressure-sensitive adhesive for adhesion of an exposure master plate without protruding from the overall width of a pellicle frame.

The above-mentioned object of the present invention has been attained by means (1) below, which is described together with preferred embodiments of the present invention.

(1) A lithographic pellicle comprising a pellicle frame, a pellicle film stretched over one end face of the pellicle frame via a pellicle film adhesive, and an exposure master plate adhesive provided on the other end face, wherein corners formed between a pellicle film adhesion face and exposure master plate adhesion face of the pellicle frame and inside and outside faces of the frame are subjected to C chamfering, and the chamfer dimension on the exposure master plate adhesion face is greater than C0.35 but no greater than C0.55, (2) the lithographic pellicle according to (1), wherein the chamfer dimension on the exposure master plate adhesion face of the pellicle frame, on the inside of the pellicle, is at least C0.4 but no greater than C0.55, (3) the lithographic pellicle according to (1) or (2), wherein the chamfer dimension on the pellicle film adhesion face of the pellicle frame is at least C0.15 but no greater than C0.25, (4) the lithographic pellicle according to any one of (1) to (3), wherein the pellicle frame has a frame thickness of 1.85 to 2.05 mm, (5) the lithographic pellicle according to any one of (1) to (4), wherein the surface of a pressure-sensitive adhesive layer for adhesion provided on the exposure master plate adhesion face of the pellicle frame is processed flat,
(6) the lithographic pellicle according to any one of (1) to (5), wherein the pellicle frame is an aluminum alloy pellicle frame having an electrodeposition-coated polymer film, and
(7) the lithographic pellicle according to (6), wherein the electrodeposition-coated polymer film is an anionic electrodeposition-coated film of a thermosetting resin.

The 'pellicle film adhesion face' means a 'pellicle film adhesive-coated end face', and the 'exposure master plate adhesion face' means an 'exposure master plate adhesive-(pressure-sensitive adhesive-)coated end face'.

A definition of "C chamfering" is described later.

BEST MODE FOR CARRYING OUT THE INVENTION

The lithographic pellicle of the present invention comprises a pellicle frame, a pellicle film stretched over one end face of the pellicle frame via a pellicle film adhesive, and an exposure master plate adhesive provided on the other end face, wherein corners formed between a pellicle film adhesion face and exposure master plate adhesion face of the pellicle frame and inside and outside faces of the frame are subjected to C chamfering, and the chamfer dimension on the exposure master plate adhesion face is greater than C0.35 but no greater than C0.55.

The present inventors have found that a lithographic pellicle for which the chamfer dimension on the exposure master plate adhesion face of the pellicle frame is at least C0.4 but no greater than C0.55 on the pellicle inside is preferable. By making the chamfer dimension of the exposure master plate adhesion face of the pellicle frame larger than is conventional it becomes possible to prevent the mask adhesive from protruding from the frame width even if the pellicle is adhered to the exposure master plate.

The present invention is explained in detail below by reference to drawings.

Figure 1:
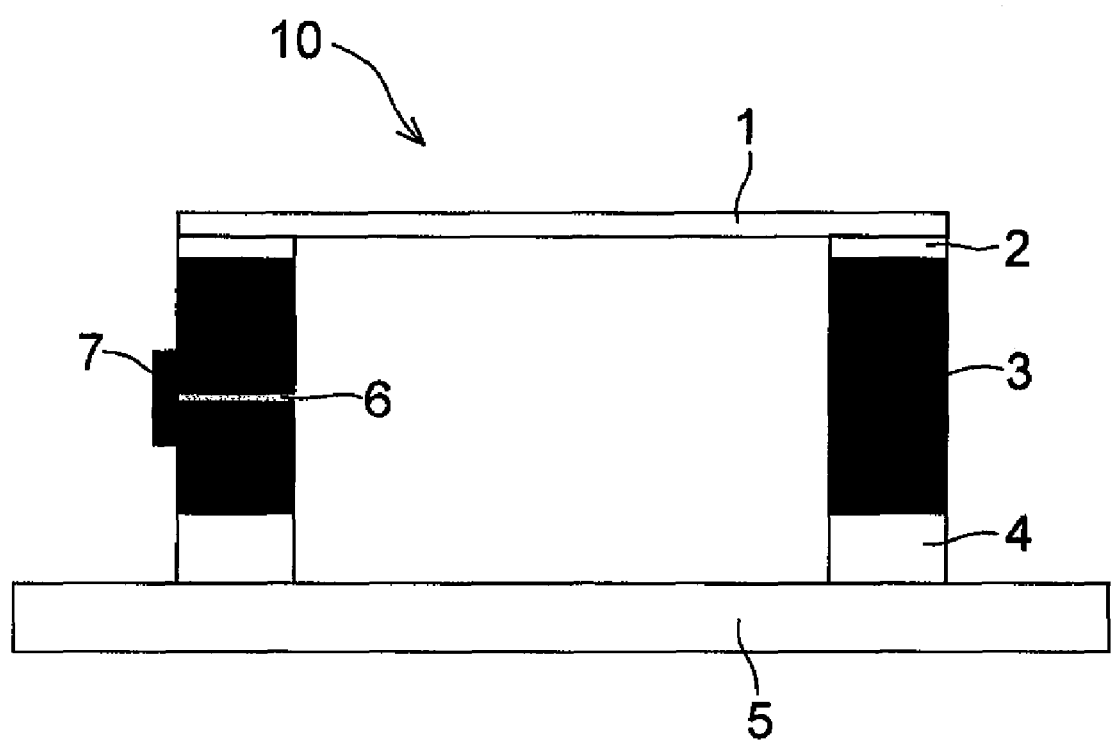
FIG. 1 is a diagram for explaining a constitutional example of a pellicle of the present invention.

As shown in FIG. 1, a pellicle 10 of the present invention is formed by stretching a pellicle film 1 over an upper end face of a pellicle frame 3 via an adhesive layer 2 for affixing the pellicle film. In this case, a pressure-sensitive adhesion layer 4 for adhering the pellicle 10 to a exposure master plate (mask substrate or reticle) 5 is usually formed on a lower end face of the pellicle frame 3, and a liner (not illustrated) is detachably adhered to a lower end face of the pressure-sensitive adhesion layer 4. The pellicle frame 3 may be provided with an atmospheric pressure adjustment hole (vent) 6, and further with a dust filter 7 for the purpose of removing particles.

In this case, the dimensions of these pellicle components are similar to those of a normal pellicle, for example, a pellicle for semiconductor lithography, a pellicle for a lithographic step of large liquid crystal display panel production, etc., and the materials of the components may be known materials, as described above.

The type of pellicle film is not particularly limited and, for example, an amorphous fluorine polymer, etc. that has conventionally been used for an excimer laser is used. Examples of the amorphous fluorine polymer include Cytop (product name, manufactured by Asahi Glass Co. Ltd.) and Teflon (Registered Trademark) AF (product name, manufactured by DuPont). These polymers may be used by dissolving them in a solvent as necessary when preparing the pellicle film, and may be dissolved as appropriate in, for example, a fluorine-based solvent.

With regard to the base material of the pellicle frame used in the present invention, a conventionally used aluminum alloy material, and preferably a JIS A7075, JIS A6061, JIS A5052 material, etc., is used, but it is not particularly limited as long as it is an aluminum alloy and the strength as a pellicle frame is guaranteed. The surface of the pellicle frame is preferably roughened by sandblasting or chemical abrasion prior to providing a polymer coating. In the present invention, a method for roughening the surface of the frame may employ a conventionally known method. It is preferable to employ a method for roughening the surface involving blasting the aluminum alloy material surface with stainless steel, carborundum, glass beads, etc., and further by chemically abrading with NaOH, etc.

Figure 2:
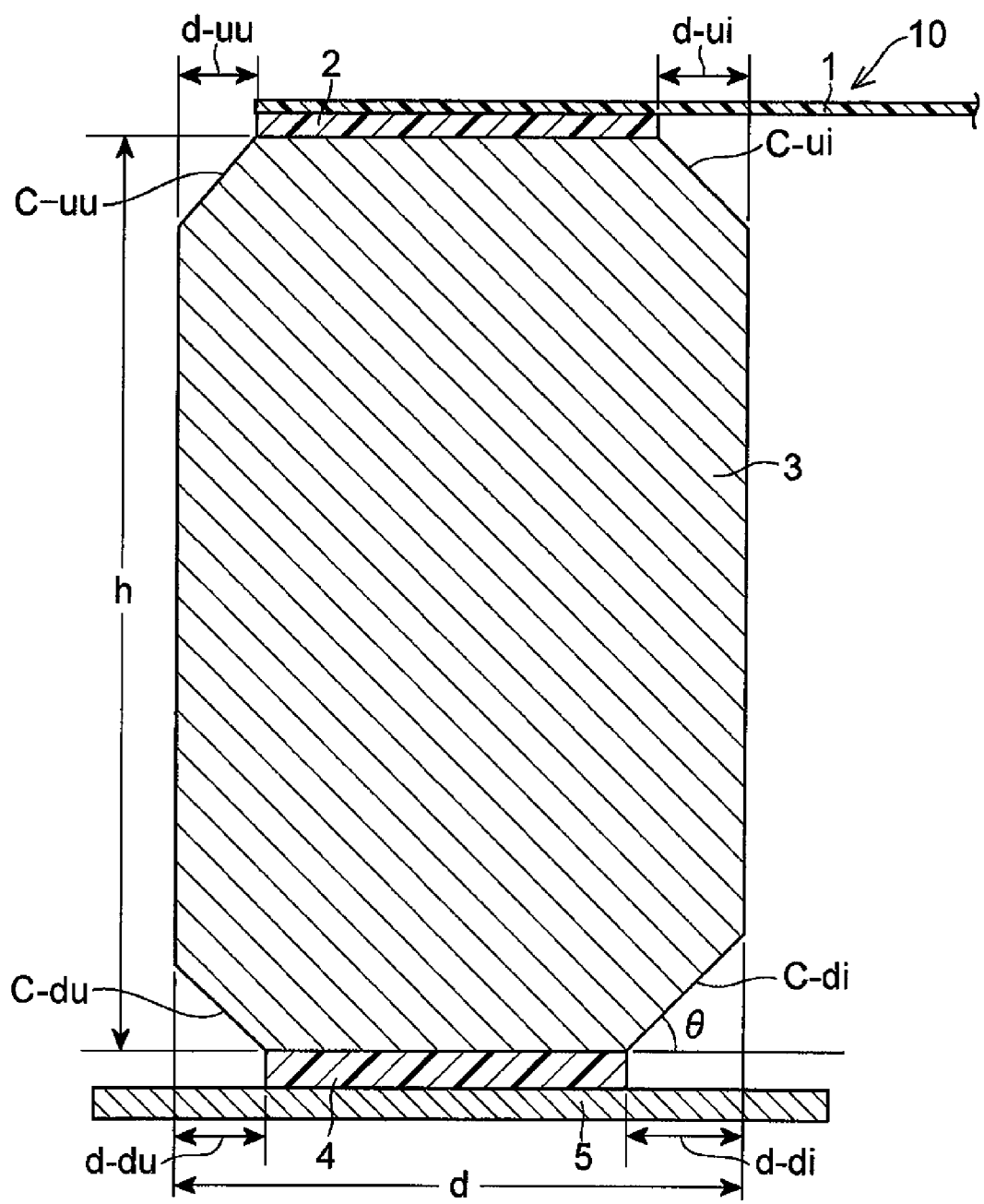
FIG. 2 is an enlarged cross-sectional view of one example of a pellicle frame of the present invention.

FIG. 2 shows a cross-sectional enlarged view of one example of a pellicle frame. The cross-section of the pellicle frame has a substantially rectangular shape having a height h and a thickness d, and a pressure-sensitive adhesive layer 2 for adhesion of a pellicle film 1 is provided on a pellicle film adhesion face, that is, an upper end face. A pressure-sensitive adhesive layer 4 for adhesion of an exposure master plate 5 is provided on an exposure master plate adhesion face of the pellicle frame 3, that is, a lower end face. In the present invention the 'pressure-sensitive adhesive for adhesion' may simply be called an 'adhesive'.

Chamfering of the pellicle frame is carried out for four corners, that is, between inside and outside faces and upper end and lower end faces of the pellicle frame. That is, the horizontal distances of C chamfering on the four C faces, that is, upper end face inside C-ui, upper end face outside C-uu, lower end face inside C-di, and lower end face outside C-du of the pellicle frame, are d-ui, d-uu, d-di, and d-du (units: mm) respectively.

The term "C-chamfering" means a chamfered portion in which the corner defined by two planes is chamfered so that the angles between the chamfer plane and the two planes defining the corner are about 45 deg. respectively. The term "C0.35", for instance, means that the cut length of the two planes cut by the chamfer is 0.35 mm.

In all cases, with regard to 'C face' chamfering in accordance with the JIS standard, the chamfering angle θ is 45°. However, the chamfering angle θ may be changed in the range of 30° to 60° and preferably 40° to 50°, and is particularly preferably C face machining.

In the present invention, chamfering on the exposure master plate adhesion face of the lower end face of the pellicle frame is preferably carried out such that the chamfer dimension d-di on the C-di face of the pellicle frame inside is at least C0.4 but no greater than C0.55.

The C chamfer dimension (d-uu, d-ui) on the pellicle film adhesion face is preferably C0.1 to C0.3, and more preferably C0.15 to C0.25.

In accordance with such a combination of horizontal lengths of the C faces, it is possible to guarantee necessary adhesive power by making the adhesion width of the pressure-sensitive adhesive for adhesion of the exposure master plate at least 1 mm.

When the pressure-sensitive adhesive protrudes into the inside of the frame, since in recent years the pattern area has been reaching up to the vicinity of the pellicle frame, the protruding pressure-sensitive adhesive photodecomposes due to exposure light, thus causing the problem of the production of foreign matter, called haze, on the exposure master plate. By increasing the C chamfer dimension on the C-di face so as to be greater than C0.35 but no greater than C0.55, the problem with the protruding pressure-sensitive adhesive can be solved, thereby preventing any degradation of the yield in semiconductor production.

Here, the pellicle frame thickness is preferably 1.85 to 2.05 mm in accordance with the standard for a stepper, and when it is simply described as '2 mm', this means that it is within the above range.

In particular, the pellicle of the present invention is preferably applied to a pellicle having a pellicle frame for which an adhesion face of a pressure-sensitive adhesive for adhesion of a mask is processed so as to have a flat shape, the pellicle being formed so that it does not interfere with the mask flatness when the pellicle is adhered with pressure, and the effect in preventing protrusion is marked.

In order to process flat an adhesion face of a pressure-sensitive adhesive for adhesion of a mask, it can be processed using a special-purpose adhesive squash-molding machine.

The adhesive squash-molding machine is a program-controlled single shaft driven machine, and it has a structure in which an upper pressure plate for processing flat a mask adhesive can be moved up and down while being maintained parallel. Specifically, a guide structure such as a linear bush is provided at four corners of the pressure plate, thereby preventing the plate from slanting when moving up and down.

Furthermore, it is preferable that the error for the point reached, in the height direction, of the pressure plate for processing flat the pressure-sensitive adhesive is controlled to within 20 to 40 μm. Moreover, the speed of travel of the pressure plate is preferably 1 to 50 mm/sec, and processing can be carried out with high precision by a structure in which the speed can be changed in the vicinity of a workpiece and pressure can be applied at low speed.

In the present invention, the pellicle frame preferably has a polymer coating, and more preferably has an electrodeposition-coated polymer film. Furthermore, the pellicle frame is preferably an aluminum alloy pellicle frame, and particularly preferably an aluminum alloy pellicle frame having an electrodeposition-coated polymer film.

The polymer coating on the surface of the pellicle frame may be provided by various methods, and in general spray coating, electrostatic coating, electrodeposition coating, etc. can be cited as examples. In the present invention, it is preferable to provide a polymer coating by electrodeposition coating.

With regard to the electrodeposition coating, either a thermosetting resin or a UV curing resin may be used. It is also possible to employ either anionic electrodeposition coating or cationic electrodeposition coating for the resins. In the present invention, since UV resistance is required, it is preferable to employ anionic electrodeposition coating of a thermosetting resin in terms of coating stability, appearance, and strength.

The surface of the polymer coating is preferably matte-finished for the purpose of suppressing reflection. Furthermore, in order to suppress the generation of organic outgas from the polymer coating, the thickness of the electrodeposition-coated polymer coating is optimized and, moreover, conditions for baking after the electrodeposition coating are preferably set so that, compared with conventional conditions, the temperature is higher and the time is longer for completion.

In accordance with a polymer coating being provided, unlike an anodized coating obtained by a conventional anodization method, it becomes possible to eliminate the inclusion and release of sulfate ion, nitrate ion, and organic acid. Since the polymer coating may be provided by coating without using sulfuric acid, nitric acid, an organic acid, etc. at all, either as a starting material or in the process, it is possible to simplify a washing step, etc., which has been necessary in order to decrease the conventional problems of sulfate ion, nitrate ion, and organic acid.

Techniques for electrodeposition coating (electrodeposition) are known to a person skilled in the art. For example, reference may be made to 1) S. Tamehiro, 'Denchakutoso' (Electrodeposition Coating) (The Nikkan Kogyo Shimbun Ltd., 1969), and 2) 'Kobunshi Daijiten' (Polymer Dictionary) (Maruzen, 1994) 'Toso/Denchaku' section (Coating/Electrodeposition) and references therein. In electrodeposition coating, resin particle ions dispersed in water are attracted by the surface of an electrode material having the opposite sign and are deposited, thus forming a polymer coating.

In the present invention, for the electrodeposition coating, a method involving anionic electrodeposition coating, in which the material to be coated is the anode, is preferred to a method involving cationic electrodeposition coating, in which the material to be coated is the cathode, since the amount of gas generated is smaller and there is less possibility of defects such as pinholes occurring in the coated film.

In the pellicle of the present invention, the polymer coating provided on the pellicle frame covers various types, such as an epoxy resin, an acrylic resin, an aminoacrylic resin, or a polyester resin, but it is preferable to form the polymer coating from a thermosetting resin rather than a thermoplastic resin. Examples of the thermosetting resin are primarily acrylic resins. After a thermosetting coating is electrodeposition coated, the coating may be thermally cured.

Furthermore, the polymer coating is preferably a matte black electrodeposition-coated polymer film, using a matte coating solution colored with a black pigment.

Prior to electrodeposition coating, it is preferable to subject the aluminum alloy frame to surface roughening by sandblasting or surface etching by means of an alkali solution.

The thickness of the electrodeposition-coated polymer coating is preferably 5 to 30 μm, and more preferably 5 to 20 μm.

Coating equipment and a coating solution for electrodeposition coating used for these purposes may be purchased as commercial products from several Japanese companies and used. For example, an electrodeposition coating solution commercially available as Elecoat from Shimizu Co., Ltd. may be used. 'Elecoat Frosty W-2' and 'Elecoat Frosty ST Satiner' are matte type thermosetting anionic electrodeposition coating solutions, and may preferably be used in the present invention.

When the polymer coating is a matte black electrodeposition-coated film, the emissivity is preferably 0.80 to 0.99. The 'emissivity' referred to here means (P1/P), which is the ratio of the energy P1 radiated from a body to the total radiated energy P with a black body (an ideal body that absorbs all wavelengths incident on the surface and neither reflects nor transmits) as a reference, and is a value measured using a TSS-5X radiometer manufactured by Japan Sensor Corporation.

By setting the chamfer dimension on the exposure master plate adhesion face to be greater than C0.35 but no greater than C0.55, it is possible to efficiently suppress protrusion of the exposure master plate adhesive while stably guaranteeing the adhesion width. As a result, the pattern area of the exposure master plate increases, the occurrence of foreign matter on the exposure master plate can be suppressed even if a pattern is provided in the vicinity of the pellicle frame, and the yield in semiconductor production can be improved.

In particular, with regard to a pellicle for which a mask adhesive is processed flat in order that it does not interfere with the mask flatness when the pellicle is adhered with pressure, compared with a case in which a conventional frame is used, it has the effect of producing a product with a stable pressure-sensitive adhesive width in high yield.

EXAMPLES

Example 1

The present invention is explained below more specifically by reference to Examples. A 'mask' in the Examples and Comparative Examples is illustrated as an example of the 'exposure master plate' and, needless to say, application to a reticle can be carried out in the same manner.

As a pellicle frame, a black anodized frame was prepared so that the frame outer dimensions were 149 mm×122 mm×5.8 mm and the frame thickness was 2 mm. Furthermore, the C chamfer dimension of a mask adhesive-coated end face of this frame was C0.40, and the C chamfer dimension of a pellicle film adhesion face was C0.20.

In accordance with a conventional pellicle production process, after the frame was subjected to precision cleaning, the mask adhesive was applied and allowed to stand for 60 minutes, and flat molding of the mask adhesive was then carried out using a special-purpose adhesive squash-molding machine. The adhesive squash-molding machine was a program-controlled single shaft driven machine, and the error for the point that a pressure plate reached was controlled to 30 μm.

In this Example, 100 pellicles were subjected to mask adhesive flat molding using this machine, and adhesive flat molding could be carried out without even one pellicle having the adhesive protruding from the frame width.

It was confirmed that when the pellicle was completed and then affixed to a mask substrate, adhesion was carried out well without the mask adhesive protruding from the frame.

Example 2

As a pellicle frame, a black anodized frame was prepared so that the frame outer dimensions were 149 mm×122 mm×5.8 mm and the frame thickness was 2 mm. Furthermore, the C chamfer dimension of the mask adhesion face of this frame was C0.45, and the C chamfer dimension of the pellicle film adhesion face was C0.20.

In accordance with a conventional pellicle production process, after the frame was subjected to precision cleaning, a mask adhesive was applied and allowed to stand for 60 minutes, and flat molding of the mask adhesive was then carried out using a special-purpose adhesive squash-molding machine. The adhesive squash-molding machine was a program-controlled single shaft driven machine, and the error for the point that a pressure plate reached was controlled to 30 μm.

In this Example, 100 pellicles were subjected to mask adhesive flat molding using this machine, and adhesive flat molding could be carried out without even one pellicle having the adhesive protruding from the frame width.

It was confirmed that when the pellicle was completed and then affixed to a mask substrate, adhesion was carried out well without the mask adhesive protruding from the frame.

Example 3

As a pellicle frame, a black anodized frame was prepared so that the frame outer dimensions were 149 mm×122 mm×5.8 mm and the frame thickness was 2 mm. Furthermore, the C chamfer dimension of the inside of the mask adhesion face of this frame was C0.50, and the C chamfer dimension of the other three was C0.20.

In accordance with a conventional pellicle production process, after the frame was subjected to precision cleaning, a mask adhesive was applied and allowed to stand for 60 minutes, and flat molding of the mask adhesive was then carried out using a special-purpose adhesive squash-molding machine. The adhesive squash-molding machine was a program-controlled single shaft driven machine, and the error for the point that a pressure plate reached was controlled to 30 μm.

In this Example, 100 pellicles were subjected to mask adhesive flat molding using this machine, and adhesive flat molding could be carried out without even one pellicle having the adhesive protruding from the frame width.

It was confirmed that when the pellicle was completed and then affixed to a mask substrate, adhesion was carried out well without the mask adhesive protruding from the frame.

Example 4

A lithographic pellicle was formed in the same manner as in Examples 1 to 3 except that as a pellicle frame a 2 mm thick frame subjected to anionic electrodeposition coating with a thermosetting resin was used instead of the 2 mm thick black anodized frame. The thickness of the coated film was 15 μm, and matte black coating was carried out using a black pigment.

In accordance with use of the electrodeposition-coated frame, compared with a black anodized frame, the amount of ionized component could be decreased.

Comparative Example 1

As a pellicle frame, a black anodized frame was prepared so that the frame outer dimensions were 149 mm×122 mm×5.8 mm and the frame thickness was 2 mm. Furthermore, the C chamfer dimension of the inside of the frame on a mask adhesion face of the frame was C0.27, and the C chamfer dimension of the others was C0.20.

In accordance with a conventional pellicle production process, after the frame was subjected to precision cleaning, a mask adhesive was applied and allowed to stand for 60 minutes, and flat molding of the mask adhesive was then carried out using a special-purpose adhesive squash-molding machine. The adhesive squash-molding machine was a program-controlled single shaft driven machine, and the error for the point that a pressure plate reached was controlled to 30 μm.

In this Comparative Example, 100 pellicles were subjected to mask adhesive flat molding using this machine, and a problem with the mask adhesive protruding from the frame width occurred in seven pellicles. It was confirmed when the machine history was checked that in the flat molding of these seven pellicles a robot carried out squashing by 20 to 30 μm more than a set value.

Comparative Example 2

As a pellicle frame, a black anodized frame was prepared so that the frame outer dimensions were 149 mm×122 mm×5.8 mm and the frame thickness was 2 mm. Furthermore, the C chamfer dimension on a mask adhesion-coated end face side of this frame was C0.60, and the C chamfer dimension of the others was C0.20.

In accordance with a conventional pellicle production process, after the frame was subjected to precision cleaning, a mask adhesive was applied and allowed to stand for 60 minutes, and flat molding of the mask adhesive was then carried out using a special-purpose adhesive squash-molding machine. The adhesive squash-molding machine was a program-controlled single shaft driven machine, and the error for the point that a pressure plate reached was controlled to 30 μm.

In this Comparative Example, 100 pellicles were subjected to mask adhesive flat molding using this machine, and adhesive flat molding could be carried out without even one pellicle having the adhesive protruding from the frame width.

It was confirmed that when the pellicle was completed and then affixed to a mask substrate, adhesion was carried out well without the mask adhesive protruding from the frame. However, since the C chamfer dimension was guaranteed to be C0.60 for the frame width of 2 mm, the adhesion width of the pressure-sensitive adhesive was less than 1.0 mm, which was an undesirable result.

EXPLANATION OF REFERENCE NUMERALS AND SYMBOLS

1: Pellicle film
2: Adhesion layer
3: Pellicle frame
4: Pressure-sensitive adhesion layer
5: Exposure master plate
6: Atmospheric pressure adjustment hole (vent)
7: Dust filter
10: Pellicle
d: Pellicle frame thickness
h: Pellicle frame height
θ: Chamfer angle
C-uu: Pellicle frame upper end face outside C face
C-ui: Pellicle frame upper end face inside C face
C-du: Pellicle frame lower end face outside C face
C-di: Pellicle frame lower end face inside C face
d-uu: Chamfer dimension of pellicle frame upper end face outside (mm)
d-ui: Chamfer dimension of pellicle frame upper end face inside (mm)
d-du: Chamfer dimension of pellicle frame lower end face outside (mm)
d-di: Chamfer dimension of pellicle frame lower end face inside (mm)

What is claimed is:

1. A lithographic pellicle comprising a pellicle frame, a pellicle film stretched over one end face of the pellicle frame via a pellicle film adhesive, and an exposure master plate adhesive provided on the other end face,
wherein corners formed between a pellicle film adhesion face and exposure master plate adhesion face of the pellicle frame and inside and outside faces of the frame are subjected to C chamfering, and the chamfer dimension on the exposure master plate adhesion face is greater than C0.35 but no greater than C0.55,
wherein the chamfer dimension on the exposure master plate adhesion face of the pellicle frame, on the inside of the pellicle, is at least C0.4 but no greater than C0.55, and
wherein the chamfer dimension on the pellicle film adhesion face of the pellicle frame is at least C0.15 but no greater than C0.25.

2. The lithographic pellicle according to claim 1, wherein the pellicle frame has a frame thickness of 1.85 to 2.05 mm.

3. The lithographic pellicle according to claim 1, wherein the surface of a pressure-sensitive adhesive layer for adhesion provided on the exposure master plate adhesion face of the pellicle frame is processed flat.

4. The lithographic pellicle according to claim 1, wherein the pellicle frame is an aluminum alloy pellicle frame having an electrodeposition-coated polymer film.

5. The lithographic pellicle according to claim 4, wherein the electrodeposition-coated polymer film is an anionic electrodeposition-coated film of a thermosetting resin.

6. A lithographic pellicle comprising a pellicle frame, a pellicle film stretched over one end face of the pellicle frame via a pellicle film adhesive, and an exposure master plate adhesive provided on the other end face,
wherein corners formed between a pellicle film adhesion face and exposure master plate adhesion face of the pellicle frame and inside and outside faces of the frame are subjected to C chamfering,
wherein the chamfer dimension on the exposure master plate adhesion face of the pellicle frame, on the inside of the pellicle, is at least C0.4 but no greater than C0.55, and
wherein the other three chamfer dimensions on the pellicle film adhesion face of the pellicle frame and on the exposure master plate adhesion face of the pellicle frame, on the outside of the pellicle, are at least C0.15 but no greater than C0.25.

7. A lithographic pellicle according to claim 6,
wherein the chamfer dimension on the exposure master plate adhesion face of the pellicle frame, on the inside of the pellicle, is C0.50, and
wherein the other three chamfer dimensions on the pellicle film adhesion face of the pellicle frame and on the exposure master plate adhesion face of the pellicle frame, on the outside of the pellicle, are about C0.20.

* * * * *